United States Patent
Nijhawan et al.

(10) Patent No.: US 11,210,153 B2
(45) Date of Patent: *Dec. 28, 2021

(54) METHOD AND APPARATUS FOR PREDICTIVE FAILURE HANDLING OF INTERLEAVED DUAL IN-LINE MEMORY MODULES

(71) Applicant: DELL PRODUCTS, L.P., Round Rock, TX (US)

(72) Inventors: Vijay B. Nijhawan, Austin, TX (US); Chandrashekar Nelogal, Round Rock, TX (US); Syama S. Poluri, Round Rock, TX (US); Vadhiraj Sankaranarayanan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 6 days.

This patent is subject to a terminal disclaimer.

(21) Appl. No.: 16/906,426

(22) Filed: Jun. 19, 2020

(65) Prior Publication Data

US 2020/0319950 A1 Oct. 8, 2020

Related U.S. Application Data

(63) Continuation of application No. 16/160,863, filed on Oct. 15, 2018, now Pat. No. 10,783,025.

(51) Int. Cl.
*G06F 11/07* (2006.01)
*G11C 29/52* (2006.01)

(52) U.S. Cl.
CPC .......... *G06F 11/076* (2013.01); *G06F 11/073* (2013.01); *G06F 11/0793* (2013.01); *G11C 29/52* (2013.01)

(58) Field of Classification Search
CPC .............. G06F 11/073; G06F 11/0727; G06F 11/0754; G06F 11/076; G06F 11/0793; G06F 11/1008; G06F 11/1068; G06F 11/1417; G06F 11/1415; G06F 12/0607; G06F 12/0646; G06F 12/16; G11C 29/42; G11C 29/04; G11C 29/08; G11C 29/12;
(Continued)

(56) References Cited

U.S. PATENT DOCUMENTS

| 6,233,662 | B1 | 5/2001 | Prince, Jr. |
| 6,480,982 | B1 | 11/2002 | Chan et al. |
| 7,694,125 | B2 | 4/2010 | Nijhawan et al. |

(Continued)

OTHER PUBLICATIONS

"NVDIMM DSM Interface V1.6" Persistent Memory Programming Interface; Aug. 9, 2017; pp. 1-39; https://docs.pmem.io/.

(Continued)

*Primary Examiner* — Gabriel Chu
(74) *Attorney, Agent, or Firm* — Larson Newman, LLP

(57) ABSTRACT

An information handling system includes interleaved dual in-line memory modules (DIMMs) that are partitioned into logical partitions, wherein each logical partition is associated with a namespace. A DIMM controller sets a custom DIMM-level namespace-based threshold to detect a DIMM error and to identify one of the logical partitions of the DIMM error using the namespace associated with the logical partition. The detected DIMM error is repaired if it exceeds an error correcting code (ECC) threshold.

20 Claims, 6 Drawing Sheets

(58) Field of Classification Search
CPC ......... G11C 29/38; G11C 29/52; G11C 29/70; G11C 29/78
See application file for complete search history.

(56) References Cited

U.S. PATENT DOCUMENTS

| | | |
|---|---|---|
| 9,720,825 B2 | 8/2017 | Berke |
| 9,842,660 B1 | 12/2017 | Karamcheti et al. |
| 2003/0188220 A1 | 10/2003 | Misra et al. |
| 2009/0164739 A1* | 6/2009 | Harikumar .............. G06F 9/542 711/153 |
| 2012/0079314 A1 | 3/2012 | Kamath et al. |
| 2015/0100746 A1 | 4/2015 | Rychlik et al. |
| 2015/0279463 A1 | 10/2015 | Berke |
| 2015/0347211 A1 | 12/2015 | Dang et al. |
| 2020/0104056 A1* | 4/2020 | Benisty .............. G06F 12/0246 |

OTHER PUBLICATIONS

"NVDIMM Namespace Specification", Apr. 2015, Intel. (Year: 2015).

Xu et al., "NOVA-Fortis: A Fault-Tolerant Non-Volatile Main Memory File system", SOSP '17, Oct. 28, 2017. (Year: 2017).

* cited by examiner

METHOD AND APPARATUS FOR PREDICTIVE FAILURE HANDLING OF INTERLEAVED DUAL IN-LINE MEMORY MODULES

CROSS-REFERENCE TO RELATED APPLICATION

This application is a continuation of U.S. patent application Ser. No. 16/160,863 entitled "Method and Apparatus for Predictive Failure Handling of Interleaved Dual In-Line Memory Modules," filed on Oct. 15, 2018, the disclosure of which is hereby expressly incorporated by reference in its entirety

FIELD OF THE DISCLOSURE

This disclosure generally relates to information handling systems, and more particularly relates to predictive failure handling of interleaved dual in-line memory modules (DIMMs).

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A system includes interleaved dual in-line memory modules (DIMMs) that are partitioned into logical partitions, wherein each logical partition is associated with a namespace. A DIMM controller may set a custom DIMM-level namespace-based threshold to detect a DIMM error and to identify one of the logical partitions of the DIMM error using the namespace associated with the logical partition. The detected DIMM error is repaired if it exceeds an error correcting code (ECC) threshold.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings.

Figure 1:
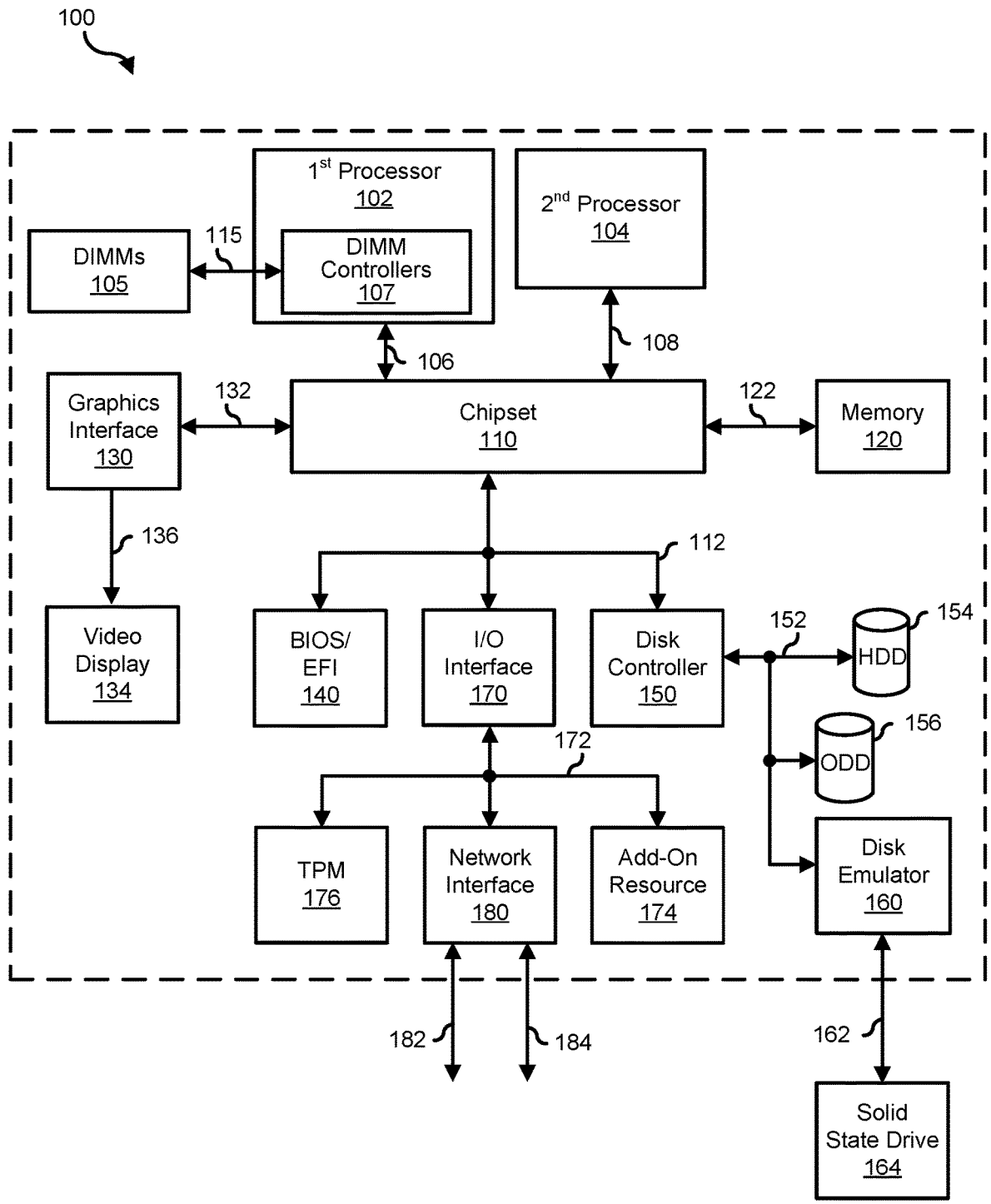
FIG. 1 is a block diagram of a generalized information handling system.

FIG. 1 illustrates a block diagram of information handling system 100. For purposes of this disclosure, the information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of the information handling system can include one or more storage devices that can store machine-executable code, one or more communications ports for communicating with external devices, and various input and output (I/O) devices, such as a keyboard, a mouse, and a video display. Information handling system can 100 also include one or more buses operable to transmit information between the various hardware components.

Information handling system 100 includes processors 102 and 104, one or more dual in-line memory modules (DIMMs) 105, a chipset 110, a memory 120, a graphics interface 130, include a basic input and output system/ extensible firmware interface (BIOS/EFI) module 140, a disk controller 150, a disk emulator 160, an input/output (I/O) interface 170, and a network interface 180. Processor 102, which may be configured to include DIMM controllers 107, is connected to chipset 110 via processor interface 106 and to the DIMMs 105 via DIMM interface 115, and processor 104 is connected to the chipset via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/EFI module 140 includes BIOS/ EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 is connected through a disk interface 152 to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a serial attached SCSI (SAS) interface, a non-volatile memory express (NVMe) interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174, to a TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/ video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents an NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
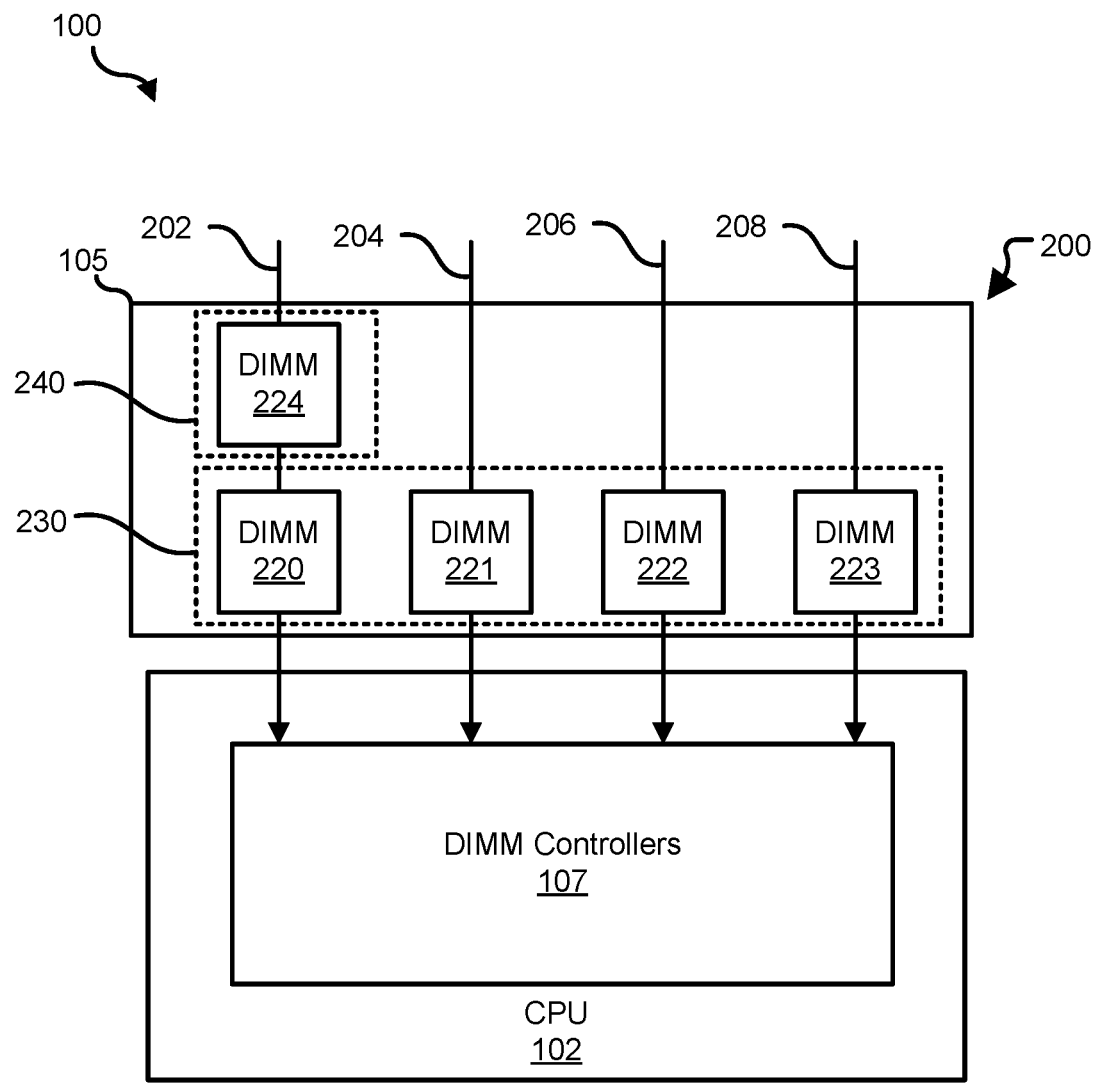
FIG. 2 is a block diagram of a portion of an information handling system supporting memory interleaving across dual in-line memory modules (DIMMs) according to an embodiment of the present disclosure.

FIG. 2 shows a portion of the information handling system 100 including the CPU 102 with DIMM controllers 107, and multiple dual data rate (DDR) channels 202, 204, 206, and 208 that can each have multiple DIMM slots per channel. The DIMM slots may accommodate the DIMMs 105 and particularly DIMMs 220, 221, 222, 223, and 224.

To statistically optimize performance, the memory controller such as the DIMM controllers 107 may provide interleaving schemes to ensure that consecutive memory accesses are distributed across the available memory resources. Within an interleave group, consecutive cache line accesses are scattered via a pre-defined algorithm among the available memory channels, and populated DIMMs to provide statistical low latency and high bandwidth for memory reads and writes. Many interleave schemes use low order or high order physical address bits to determine where the cache line will be located. Some interleave schemes are designed such that only DIMM resources of the same capacity and architecture are interleaved together. In configurations having DIMMs of multiple capacities and architectures populated within a memory system, the BIOS and the memory controller of the information handling system 100 can create and configure a separate interleave group for each DIMM capacity and/or architecture type. The interleaving group can be spread across CPUs, across memory controllers, across DDR channels, across DIMMs within a channel, across ranks per DIMM, and in various combinations thereof.

A rank of a memory system can include a set of DRAM devices that are accessed simultaneously in order to access a required data width, such as 72 bits wide on information handling systems that support memory error correcting code (ECC) coding, or 64 bits wide on information handling systems that do not support ECC coding, though other widths are also possible. Multiple DRAM devices are needed to form a rank when the DRAM devices have widths of 4-bits, 8-bits, 16-bits, and 32-bits. Other memory devices widths and channel data widths are possible. Internal to a DRAM, memory is organized in multiple banks, with common numbers of 4, 8, 16, and 32 banks per DRAM. Each of DIMMs 105 may have 8 ranks per DIMM, and 16 banks per rank, and thus 128 addressable banks per DIMM.

The CPU 102 may maximize performance of memory subsystems of the DIMMs on the DDR channels 202, 204, 206, and 208 by performing the memory interleaving across the DIMMs. The performance of the memory subsystem of the DIMMs 220-224 may be maximized in response to the CPU 102 minimizing average and peak memory latency during accesses to the DIMMs. For example the CPU 102 may group the DIMMs 220-224 into two interleave groups, with the DIMMs 220-223 being grouped into a first interleave group 230, and the DIMM 224 being grouped as a second interleave group 240. In this example, the DIMMs 220-224 are assumed to all have the same capacity and organization, such as the same DIMM capacity, number of ranks, and number of banks such as 16 banks per rank. Thus, all of the ranks and banks within the DIMMs 220-223 are included in the first interleave group 230, and all of the ranks and banks within the DIMM 224 are included in the second interleave group 240.

The example memory interleaving in FIG. 2 may provide the most efficient performance for the first interleave group 230, but the second interleave group 240 may be left with ineffective performance because the first interleave group can have 100% of the memory bandwidth by interleaving consecutive cache line block accesses to a different DIMM on a different DDR channel. For example, cache memory accesses by the CPU 102 can proceed through the DDR channels 202, 204, 206 and 208, such that order of accesses can include the first DIMM 220 on DDR channel 202, then the DIMM 221 on DDR channel 204, then the DIMM 222 on DDR channel 206, and then the DIMM 223 on DDR channel 208. Thus, accesses to memory locations in the first interleave group 230 involves 100% of the DDR channels 202-208, such that bandwidth or performance level for the first interleave group 230 can be 100%. As opposed to the first interleave group 230, the performance level of the second interleave group 240 is about 25% because all memory accesses to this group are limited to the DIMM 224 on the DDR channel 202, such that the other DDR channels 204, 206, and 208 are not utilized in the second interleave group 240.

The CPU 102 may implement the memory interleaving of the DIMMs 220-224 in such a way as to make the performance levels of the two interleave groups be statistically equal. The CPU 102 can implement equal performance levels by allocating the first interleave group 230 and the second interleave group 240 to have access to memory locations on each of the DDR channels 202-208. For example, each interleave group can span across all of the DDR channels 202-208 and the CPU 102 can allocate each interleave group all of the banks of a single DIMM on any DDR channel having multiple DIMMs. In this example, the first interleave group 230 can include all banks of DIMM 220, and the second interleave group 240 can include all of the banks of DIMM 224, both of which are on memory channel 202. The CPU 102 can then divide the banks of the remaining DIMMs 221-223 in half, such that each interleave group includes half of the banks of each of these DIMMs. For example, the first interleave group 230 can include all 16 banks of DIMM 220 and banks 0-7 of DIMMs 221-223, and the second interleave group 240 can include all 16 banks of DIMM 224 and banks 8-15 of DIMMs 221-223.

Other methods for implementing the memory interleaving are described in U.S. Pat. No. 9,720,825 B2, the disclosure of which is incorporated herein by reference. In all of the memory interleaving described herein, the CPU 102 or the DIMM controllers 107 may be configured to partition the interleaved DIMMs into one or more logical partitions and each logical partition can be stored as a rank that is associated with a namespace. For example, the CPU 102 or the DIMM controllers 107 may configure the interleaved DIMMs 220-223 of the first interleave group 230 to have multiple logical partitions per DIMM. The namespace associated with each of the logical partitions may include a particular number of banks, a physical address of the DIMM, and portions allocated to the namespace for that particular DIMM. In this example, the CPU 102 or the DIMM controllers 107 may be configured further to implement the custom DIMM-level namespace-based threshold for predictive failure handling of the interleaved DIMMs as further described with respect to FIG. 3 below.

In an embodiment, the DIMMs 105 may include non-volatile DIMMs (NVDIMMs), volatile DIMMs such as a dynamic random access memory (DRAM), or a combination thereof. The DIMMs can further include interleaved DIMMs, non-interleaved DIMMs, or a combination of both. Furthermore, information stored on each DIMM may be duplicated on the same DIMM or in a different DIMM to create, for example, redundancy so that no data is lost in case of a DIMM failure.

The processor 102, which includes the DIMM controllers 107, is responsible for maintaining namespace labels that describe namespaces on the DIMMs 105. Each of the DIMMs, for example, may include multiple namespace labels and as such, each DIMM can include multiple namespaces. The namespace labels for each namespace may describe a physical address and a range of portions of the namespace on that given DIMM. In this example, each DIMM namespace is described by a set of namespace labels that may reside on each DIMM and on a namespace label data area on the DIMM controllers 107. The DIMM controllers 107 are interchangeably referred to herein as the processor 102 or the memory controller.

To perform predictive failure handling such as a prediction of a partial or full failure on a module of the DIMMs 105 where the failure may result in data unavailability for an entire namespace on the DIMM and rendering retrieval of data impossible, the processor 102 or the DIMM controllers 107 are configured to implement a custom DIMM-level namespace-based threshold. For example, the configured custom DIMM-level namespace-based threshold may be used to detect the presence of a DIMM error and to identify namespace associated with a logical block or logical partition of the DIMM error, and to determine an impact of the detected DIMM error at a system level of the information handling system 100. The DIMM controllers 107 or the processor 102 utilize the associated namespace of the logical block or logical partition to determine a specific location of the detected DIMM error within the DIMMs 105 and to perform an appropriate repair mechanism in response to the determined impact of the detected DIMM error on the system level.

Figure 3:
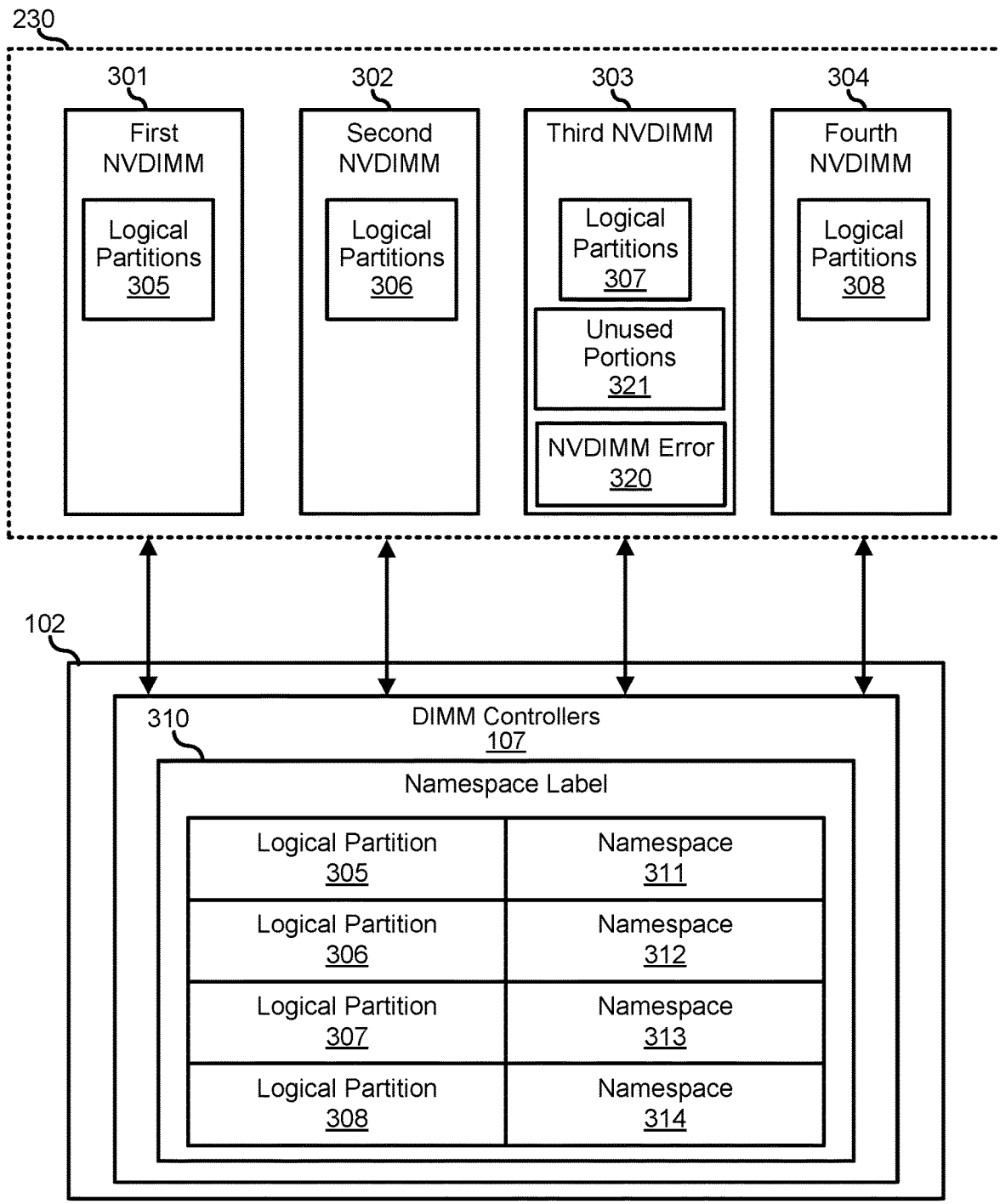
FIG. 3 is a block diagram of a server including an interleaved non-volatile DIMMs (NVDIMMs) of an information handling system according to an embodiment of the present disclosure.

FIG. 3 shows a processing device configured to set custom DIMM-level namespace-based threshold for predictive failure handling of DIMM errors across interleaved NVDIMMs. As shown, the processor 102 is coupled to the interleaved DIMMs 105 that include a first non-volatile DIMM (NVDIMM) 301, a second NVDIMM 302, a third NVDIMM 303, and a fourth NVDIMM 304. The processor 102 can be configured to partition the NVDIMMs 301-304 into one or more groups of logical blocks or partitions with each group being stored as a rank that is associated with a namespace. The partitioning can be stored by the NVDIMMs 301-304 at logical partitions 305-308, respectively. Each of these logical partitions 305-308 may include a register with information regarding the NVDIMM's physical address, assigned logical partition or group, range of portions allocated to the assigned logical partition, namespace associated with the logical partition, and namespace label that describes the associated namespace. Thus, each NVDIMM can include or be divided into multiple logical partitions that correspond to multiple namespaces as well. Furthermore, the processor 102 can modify, replace, cancel, etc. the logical partitions that the processor 102 assigns or configures to each of the NVDIMMs 301-304.

In an embodiment the DIMM controllers 107, or the memory controller that is coupled to the interleaved DIMMs 105, can include a namespace label 310 that stores the namespaces for each of the NVDIMMs 301-304. Each NVDIMM can include one or more logical partitions where each logical partition can be stored as a rank. As such, each NVDIMM can be associated with one or more namespaces on the namespace label 310. In the embodiment illustrated in FIG. 3, the logical partitions 305-308 can be stored or represented as namespaces 311-314, respectively. In this example, only one logical partition has been configured for each NVDIMM although multiple partitions can be implemented to correspond to multiple namespaces at the namespace label 310. For example, in case of eight logical partitions configured on the first NVDIMM 301, there may be eight namespaces at the namespace label 310 that may define these logical partitions. Furthermore, the logical partition can be applied across multiple NVDIMMs and not just limited to a particular NVDIMM. For example, the first NVDIMM 301 and second NVDIMM 302 can include contiguous 64 Gbits memory addresses with each NVDIMM having 28 Gbits memory address. In this example, a single namespace can represent the first and second NVDIMMS at the namespace label 310.

The processor 102, and particularly the DIMM controllers 107, is configured to set the custom DIMM-level namespace-based threshold to implement the predictive failure alerting mechanism that is defined for different namespaces and interleaved usage. Particularly, the DIMM controllers 107 utilize the namespace label 310 to identify logical partitioning status of each of the NVDIMMs 301-304. Upon detection of an NVDIMM error 320, the DIMM controllers 107 can determine a particular location, logical partition or logical block of the detected NVDIMM error 320 based on the namespace associated with the particular NVDIMM that generated the NVDIMM error 320.

The detection of the NVDIMM error 320 can be initiated by each of the NVDIMMs 301-304. Upon detection by the NVDIMM, the corresponding NVDIMM sends an alert signal to the DIMM controllers 107. The alert signal may include information regarding affected logical partition, physical address of the involved NVDIMM, presence of NVDIMM error 320 exceeding pre-determined thresholds such as an error correcting code (ECC) threshold, and the like.

In an embodiment, the set custom DIMM-level namespace-based threshold on the DIMM controllers 107 utilizes the ECC threshold to determine an impact of the detected NVDIMM error 320 at a system level. In response to the determination of impact of the detected NVDIMM error 320 at the system level, the processor 102 implements appropriate repair mechanisms during boot time or run time as described herein.

The NVDIMM error 320 can include a partial or total error, an error with a high error rate, or an error that is within a critical region range of the ECC threshold that may result in data unavailability for the entire namespace rendering the retrieval of the data impossible. For example, the NVDIMM error 320 occurs on the third NVDIMM 303 that includes the logical partitions 307 as shown. In this example, the processor 102 receives the alert signal from the third NVDIMM 303 and the processor 102 identifies the corresponding logical partition through the associated namespace to determine the exact locations of the detected NVDIMM error 320. With the identified particular location of the detected error 320, the processor 102 is configured to determine the impact of the detected NVDIMM error 320 at the system level. Based upon the determined impact of the detected NVDIMM error 320 upon the same associated namespace or upon a different namespace, the processor 102 is configured to perform the appropriate repair mechanism on the data of the same associated namespace or the different namespace.

For example, the appropriate repair mechanism can include remapping or mapping of data on the namespace 313, which is the associated namespace for the NVDIMM error 320, to another NVDIMM or different namespace such as the namespace 311. In another example, the processor 102 can map the data from the third NVDIMM 303, which includes the NVDIMM error 320, to unused portions such as unused portions 321 of the third NVDIMM 303. The unused portions 321 may include portions of the third NVDIMM 303 that were not affected by the presence of the NVDIMM error 320. In another example, the processor 102 can map the data from the third NVDIMM 303 to a persistent memory other than the DIMMs 105. In other words, the processor 102 can duplicate, modify, transfer, and or cancel data within the same or a different namespace, or restore affected namespace to another namespace on the namespace label 310 as described herein.

The processor 102 can further implement the repair mechanism by bypassing affected memory modules. For example, the BIOS system can exclude failed persistent memory NVDIMM from single page application (SPA) address map during a system reboot until the persistent memory is physically replaced. In this example, the BIOS can further report to operating system (OS) of the information handling system 100 to remove and replace affected SPA ranges to another SPA ranges. In another example, in case of multiple errors pointing to physical DIMM device, the BIOS can potentially enable spare rank of persistent memory DIMMS and after completion of this rank sparing, the BIOS may forward address translation register to this rank thereby taking care of any critical failure that may occur on the failing rank. The NVDIMMs 301-304 are described by the BIOS to the OS via advanced configuration and power interface (ACPI)—defined NVDIMM firmware interface table (NFIT).

Figure 4:
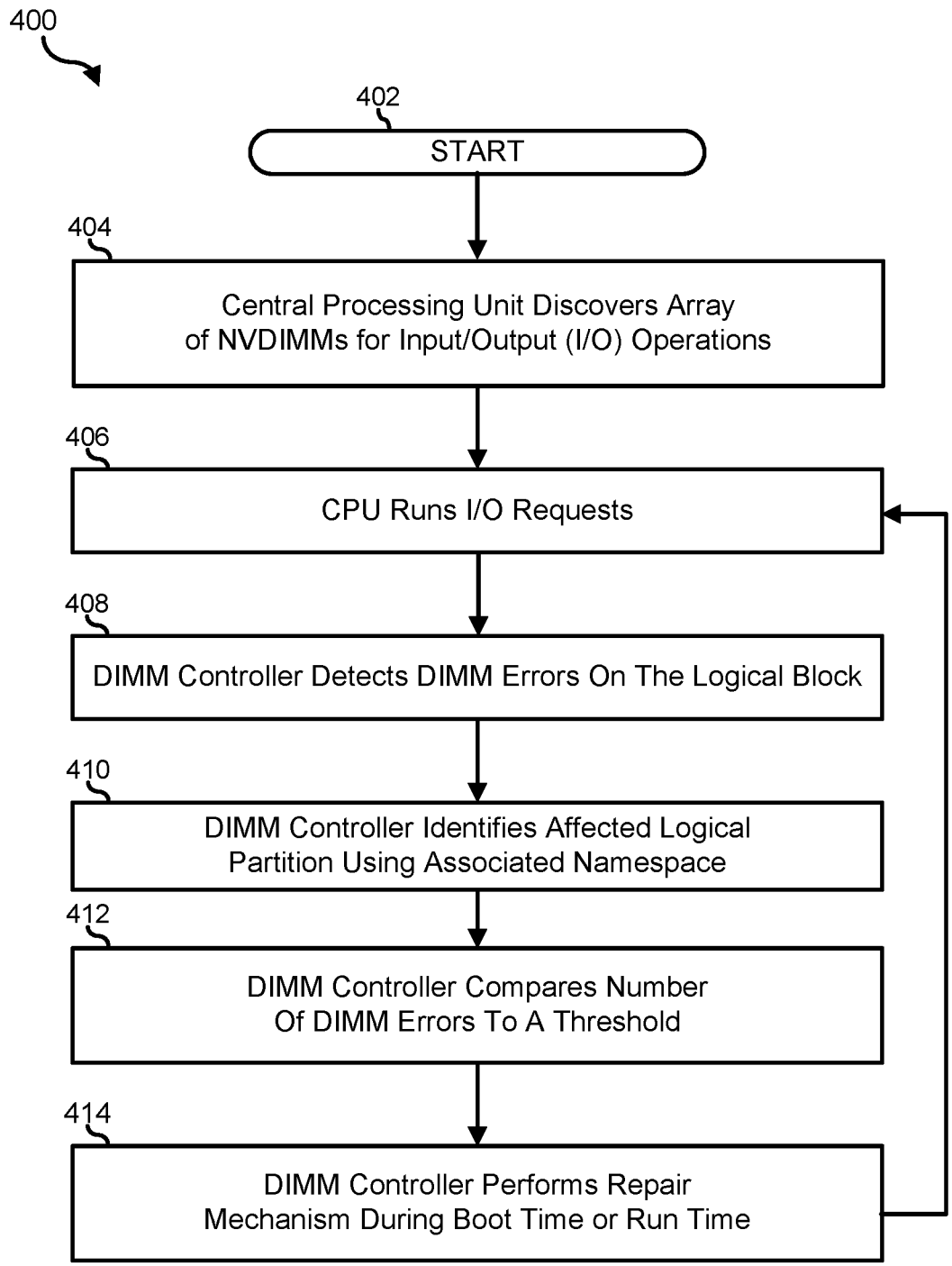
FIG. 4 is a flow chart showing a method of implementing a custom DIMM-level namespace-based threshold for predictive failure handling of DIMM errors according to an embodiment of the present disclosure.

FIG. 4 shows a method of implementing a custom DIMM-level namespace-based threshold for predictive failure handling of DIMM errors as described herein. Particularly, the flow chart 400 may be employed to identify DIMM errors from a logical block or partition within a given logical block of the NVDIMMs 301-304.

In an embodiment, the I/O operations on the array of storage devices may be accessed at a granularity of the size of the logical block and the logical blocks are addressed by logical block address (LBA). For example, each of the NVDIMMs 301-304 may be accessed at a granularity of the logical block that may be associated with a particular namespace on the namespace label 310. At step 404, the NVDIMMs 301-304 are discovered by the CPU 102 for the present I/O operations. In step 406, the CPU 102 runs I/O operations to a given logical block on the NVDIMM of the NVDIMMs 301-304. Such I/O operations may be initiated by the DIMM controllers 107, for example, in response to an I/O request received from software and/or OS executing on a host processing device of the information handling system 100.

In step 408, each DIMM controller operates to detect one or more NVDIMM errors on the logical blocks addressed by the LBA. Examples of possible types of such NVDIMM errors that may be detected include unrecoverable read error, read failure during a write I/O request that is made in order to do read-modify write, and the like.

In step 410, the DIMM controller identifies the involved logical partition and the associated namespace at the namespace label 310 in order to determine specific NVDIMM location or logical partition location of the NVDIMM error. In step 412, the DIMM controllers 107 compare the number of occurrences of the NVDIMM errors to a threshold. In response to this comparison, at step 414, the DIMM controllers 107 can be configured to perform repair mechanism during boot time or run time when the number of occurrences of the DIMM errors exceeds the threshold. The repair mechanism may include regenerating of data for each logical block that has reported errors. This regeneration is accomplished, for example, by reconstructing the contents of a given logical block from parity information kept in the DIMMs 105, or by accessing data kept in a mirror image drive of the DIMMs. In this example, the CPU 102 may write the regenerated data for all logical blocks with reported errors to the DIMMs 105.

Figure 5:
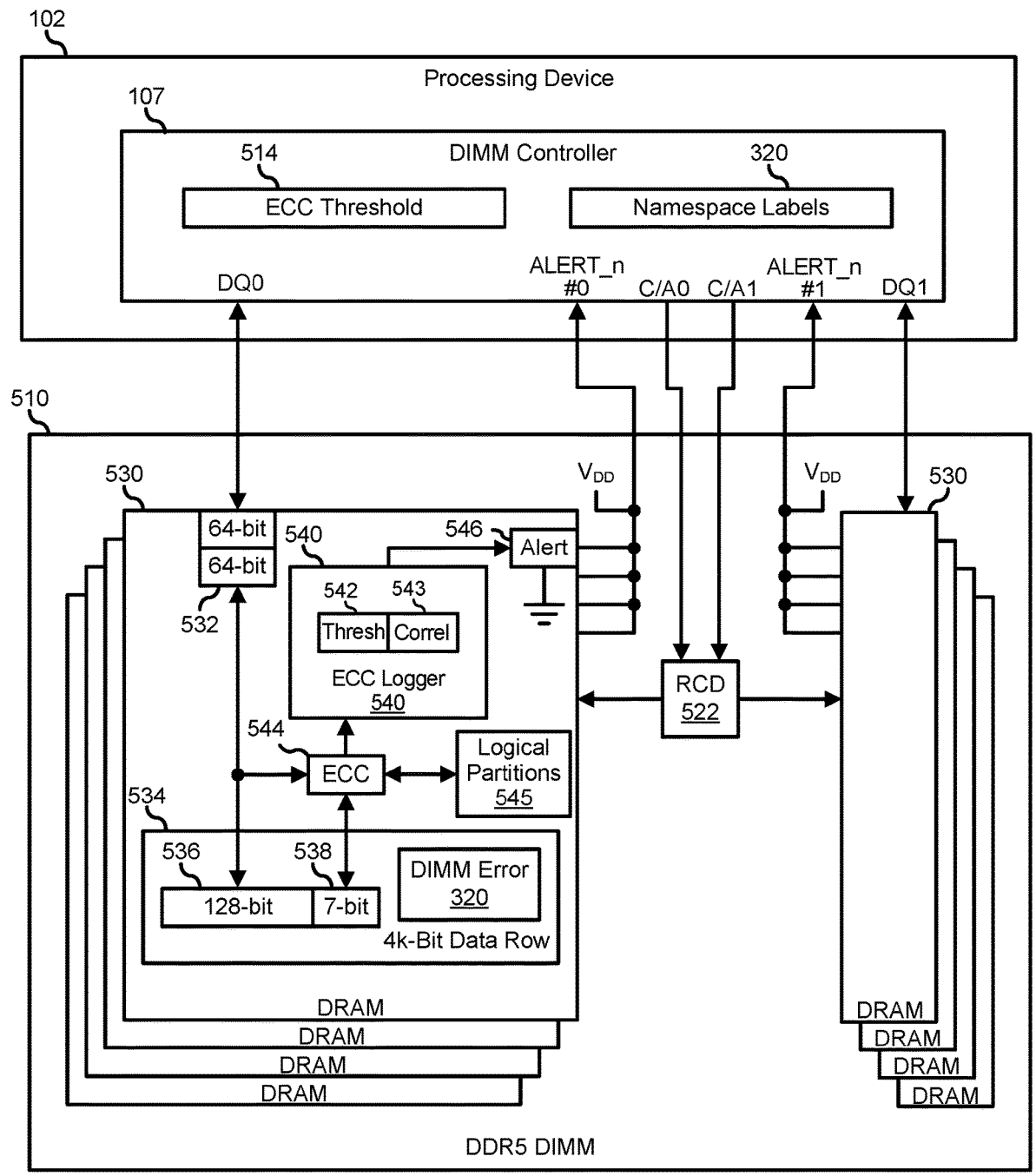
FIG. 5 is a block diagram of an information handling system implementing predictive failure detection on DIMMs using on-die error correcting code (ECC) capabilities according to the present disclosure.

FIG. 5 is a block diagram of implementing predictive failure detection on DIMMs using on-die ECC capabilities. The example DIMM includes a DIMM from the DIMMs 105 and may have different endurance, electrical, or thermal tolerances as compared to the other DIMMs. The example DIMM further includes a fifth generation double data rate (DDR5) DIMM that provides higher data storage, persistent memory, higher data transfer rates and greater DIMM densities than the preceding double data rate (DDR) generations. The DDR5 DIMM includes dynamic random access memory (DRAM) devices and on-die ECC capabilities.

As a general overview of the example embodiment in FIG. 5, the example DDR5 DIMM performs a detection of DIMM errors and sends alert signals to the DIMM controller. The alert signal may include affected logical partitions and other information associated with the detected DIMM error. In response to the received alert signal, the DIMM controller uses the namespace label to identify specific location of DIMM error using namespace associated with the affected logical partition. The DIMM controller further uses the ECC threshold to determine whether appropriate measures are to be implemented. Thereafter, the DIMM controller or the DDR5 DIMM facilitates appropriate repair mechanism to take effect in boot time or run time. The repair mechanism may include redirecting access to unused portions of the DIMM, or redirecting access to another DIMM within the same or different namespace.

As shown, the processor 102 is coupled to a DDR5 DIMM 510. The processor 102 is implemented as a two-channel DDR5 architecture, and is configured to utilize the DIMM with DRAM devices that provide an indication when a number of on-die ECC errors on the DRAM device exceed a user programmable ECC threshold, or the number has reached a critical region range of the ECC threshold, or the number exceeds a user programmable ECC rate threshold. Each DRAM device in a particular DDR5 channel is connected together to provide an alert signal to the DIMM controller 107 when that DRAM device detects an error. In a particular embodiment, ALERT_n signals from all of the DRAMs of DIMM 510 are wired together in a wired-OR configuration, using an open-drain with pull-up topology, or another suitable topology, as needed or desired. The thresholds are programmable by the DIMM controller with values set by system management defaults or by user specification.

When the DIMM controller 107 detects the assertion of the ALERT_n signal on one of the DDR5 channels, and determines that the ALERT_n signal was asserted by a particular DRAM device, the DIMM controller 107 identifies affected logical partition through the associated namespace. The DIMM controller 107 further initiates repair mechanisms or steps to prevent correctable on-die ECC errors from evolving into crippling uncorrectable system level errors that may affect the operation of the information handling system and particularly, the CPU 102. For example, the DIMM controller 107 can reduce a data transfer rate on the involved DDR5 channel; can isolate the involved DDR5 channel; can remap the data from the affected DDR5 channel to another channel or unused portions within the same or different DIMM 510, can remap the data from the affected DIMM 510 to another persistent memory (not shown), can bypass the use of the affected logical partitions on the DDR5 DIMM, and the like. The DIMM controller 107 may further maintain a history of the assertions of the ALERT_n signal for logging ECC errors, and can utilize the history to set the threshold in the DRAM devices, and can perform various statistical analysis on the history to predict failures of a particular logical partition, of a particular row of the DRAM device, of a particular DRAM device, of a DDR5 channel, or of the DIMM itself. The DIMM controller 107 further utilizes the namespace label that implements a file system to identify the involved logical partitions and associated namespaces for the on-die ECC errors.

The processor 102 includes the DIMM controller 107 with an ECC threshold setting 514 and the namespace label 310. The processor 102 represents the hardware, software, firmware, and other elements associated with the performance of the processing tasks associated with information handling system. As such, the processor 102 may be understood to include one or more data processors or processing cores, one or more I/O devices such as processor, memory, or I/O controller hub, system memory including random access memory (RAM) and system read-only memory (ROM), mass data storage devices, video processors, network interface devices, or other devices typical to an information handling system, as needed or desired.

The DIMM controller 107 may represent a structure or device of the processor 102 that manages the flow of data going to and from the DIMM 510. The DIMM controller 107 is further configured to implement a two-channel DDR5 architecture that includes connecting the DIMM controller 107 to the DIMM 510 via two DDR5 channels (channels 0 and 1). Each channel includes a data bus (DQ0 and DQ1) and a command/address bus (C/A0 and C/A1), and is configured to receive an ALERT_n signal (ALERT_n #0 and ALERT_n #1).

The ECC threshold setting 514 is utilized for the custom DIMM-level namespace-based threshold that is configured on the DIMM controller 107 or the processor 102. Furthermore, the DIMM controller 107 utilizes the ECC threshold setting 514 to evaluate the occurrence of ECC error related assertions of the ALERT_n signal, and to determine an appropriate threshold to provide to the DRAM devices. In a particular embodiment, the ECC threshold setting 514 includes separate on-die ECC threshold settings for each DIMM, for each channel, for each DRAM device of the DIMM 510, for each DIMM in the DIMMs, or for other memory organizations, as needed or desired. In this way, the DIMM controller 107 can assert greater control over the received ALERT_n signals, by, for example, increasing a threshold for a known problem that is already otherwise being mitigated.

The namespace label 310 includes namespaces for different logical partitions on the DIMM 510. In an embodiment, the namespace and the corresponding logical partitions can be dynamically adjusted by the DIMM controller 107 as needed or desired. Furthermore, the DIMM controller 107 can replace, adjust, or cancel the logical partition that is associated with the namespace during the implementation of the appropriate repair mechanism. Furthermore still, the DIMM controller 107 is saving the namespace to be persistent and available to BIOS (System Firmware) across reboots. As described herein, the namespace is used for example, by the DIMM controller 107 to remap data when performing the preventive repair in response to detected errors from the DIMM 510.

For example, the DIMM controller 107 utilizes the namespace label 310 to identify the involved logical partition thorough the associated namespace to determine specific location of the detected error. In this example, the DIMM controller 107 can remap the data from the associated namespace to another DIMM on the same namespace or different namespace.

The DIMM 510 includes a Register Control Device (RCD) 522, and Dynamic Random Access Memory (DRAM) devices 530. The DIMM 510 is illustrated herein to include RDC 522 that is connected to command/address bus C/A0 and to command/address bus C/A1 to receive command and address information from DIMM controller 107 for DDR5 channel 0 and DDR5 channel 1, respectively. RCD 522 is also connected to DRAM devices 530 to provide the command and address information to the DRAM devices. DRAM devices 530 are connected to data bus DQ0 and to data bus DQ1 to transfer data between the DRAM devices and DIMM controller 107. Data bus DQ0 and data bus DQ1 each represents a 40-bit wide communication path to carry 32-bits of memory data, and 8-bits of ECC data.

For normal operation, memory transactions for memory locations associated with DRAMs 530 are conducted on one of DDR5 channel 0 or DDR5 channel 1. For example, a memory read to a memory location associated with DRAMs 530 on DDR5 channel 0 will start with DIMM controller 107 presenting command and address information on command/address bus C/A0. RCD 522 will provide the command and address information to DRAMs 530 on DDR5 channel 0, and the DRAMs will provide the read data from the addressed memory location to DIMM controller 107 on data bus DQ0. In another example, a memory write to a memory location associated with DRAMs 530 on DDR5 channel 1 will start with DIMM controller 107 presenting command and address information on command/address bus C/A1 and the write data on data bus DQ1. RCD 522 will provide the command and address information to DRAMs 530 on DDR5 channel 1 and the DRAMs will read the data from DQ1 and store the data to the addressed memory location.

Each DRAM device 530 includes data buffers 532, data rows 534, an ECC logger 540 with an ECC threshold register 542, a data ECC checker and corrector 544, logical partitions 545, and alert logic 546. Data buffers 532 are connected to data bus DQ0 to receive write data from DIMM controller 107 and to provide read data to the DIMM controller 107. Data buffers 532 are configured to store and retrieve data from data rows, based upon whether command information received on command/address bus C/A0 indicates whether a memory transaction is a memory write transaction or a memory read transaction. Data rows 534 represent the addressable data storage capacity of DRAM device 530, and the data stored or retrieved by data buffers 532 is directed to a particular data row based upon address information received on command/address bus C/A0. In a particular embodiment, transactions on DDR5 channel 0 and DDR5 channel 1 consist of a burst of 16 data writes or data reads. Thus, assuming that DRAM device 530 is a 4-bit device, then a burst write or burst read will utilize a 64-bit data buffer. DRAM device 530 is configured such that data stored in storage rows 534 are stored 128-bits at a time, such as to a data storage location 536 in the storage rows. As such, data buffers 532 are illustrated as consisting of two 64-bit data buffers. As illustrated, data rows 534 each store 4 k-bits of data, or 32 ($=2^5$) data storage locations similar to data storage location 536. The skilled artisan will recognize that other memory configurations and data handling schemes may be utilized as needed or desired. It will be understood that henceforth, where a function or feature of a DRAM device is described, the function or feature is present on each of the other DRAM devices of DIMM 510, and that where a function or feature is described with respect to one of DDR5 channel 0 and DDR5 channel 1, that the function or feature is mirrored on the other DDR5 channel, unless otherwise noted.

In addition to storing and retrieving data from data storage location 536, each transaction between data buffers 532 and the data storage location is assured to communicate the data correctly by the addition of data ECC checker and corrector 544 which operates to calculate seven bits of ECC data with each 128-bit write to data storage location 536, and to store the ECC data to a 7-bit ECC storage location 538 associated with each data storage location of data rows 534. Data ECC checker and corrector 544 also operates to read the seven bits of ECC data from ECC storage location 538 with each read from data storage location 536, and to determine if there are any bit errors in the data from the data storage location and the ECC storage location. Furthermore, the data ECC checker and corrector 544 reads from the logical partitions 545 the particular assigned logical partition to which the detected error is associated with. For example, the detected error is found on the DIMM 510. In this example, the data ECC checker and corrector 544 reads the assigned logical partition and reports the assigned logical partition to the DIMM controller 107.

In a particular embodiment, data ECC checker and corrector 544 is further configured to implement the mapping of data and other repair mechanisms as instructed by the DIMM controller 107. For example, ECC checker and corrector 544 identifies a particular error location within the DIMM 510 and reports the associated logical partition of the specific error location to the DIMM controller 107. In this example, the DIMM controller 107 utilizes the namespace label 310 to identify the namespace or file name associated with the reported logical partition. Thereafter, the DIMM controller 107 can perform the repair mechanism by instructing the data ECC checker and corrector 544 to implement the repair mechanism as needed or desired.

When the data ECC checker and corrector 544 detects on-die ECC errors in the data stored in data rows 534 in response to a memory read transaction, the data ECC checker and corrector 544 provides an error signal to the ECC logger 540. ECC logger 540 operates to compile information related to ECC errors, including the number and rate of detected ECC errors. ECC logger 540 also operates to obtain correlation information that relates the ECC errors to the particular data storage location 536 and ECC storage location 538, to the particular data rows 534, or to other data structures included on DRAM device 530, and to store the correlation information for later retrieval and analysis in correlation information storage 543. Finally, ECC logger 540 operates to provide an alert indication to alert logic 546 to provide an ALERT_n signal to DIMM controller 107 when an ECC error count exceeds an ECC error threshold, is within critical region range of the ECC error threshold, or when the ECC error rate exceeds an ECC error rate threshold, as provided by an ECC threshold register 542 in the ECC logger 540. Thus, in a particular embodiment, ECC threshold register 542 represents a storage location for storing a reference value for one or more of an ECC error threshold, critical region of the ECC error threshold, or an ECC error rate threshold.

Alert logic 546 receives the internal alert indication from ECC logger 540 and asserts the ALERT_n signal to DIMM controller 107 by pulling a normally logic high state ALERT_n #0 bus to a logic low state by connecting the ALERT_n #0 bus to a ground plane of DIM 510. The ALERT_n signal is thus a logic low signal. The ALERT_n #0 bus is connected to an ALERT_n # pin of all of the DRAM devices 530 associated with DDR5 channel 0 in a wired-OR configuration, where the ALERT_n #0 bus is normally pulled to the logic high state, such as via a pull-up resistor connected between a $V_{DD}$ plane of DIMM 510 and the ALERT_n #0 bus. As such, one or more of DRAM devices 530 can simultaneously assert their respective ALERT_n # pins, and DIMM controller 107 is, by virtue of the assertion of the ALERT_n signal alone, not able to distinguish which one of the DRAM devices has asserted its ALERT_n # pin. Thus, when DIMM controller 107 detects the ALERT_n signal on the ALERT_n #0 bus, the DIMM controller will poll each of the DRAM devices 530 on DDR5 channel 0 to determine which one or more of the DRAM devices asserted the ALERT_n signal, and to determine the reason for asserting the ALERT_n signal.

When DIMM controller 107 determines that a particular DRAM device 530 has asserted the ALERT_n signal due to an indication from ECC logger 540 that an ECC threshold has been exceeded, is within critical region range of the ECC threshold, or ECC rate threshold has been exceeded, then the DIMM controller 107 initiates a transaction with DIMM 510 to determine the nature of the ECC errors that cause the assertion of the ALERT_n signal. In particular, DIMM controller 107 operates to read the contents of correlation information storage 543 to determine the particular data storage location 536 and ECC storage location 538, the particular data rows 534, or other data structures included on DRAM device 530 that were the source of the ECC errors. Thereafter, the DIMM controller 107 utilizes the identified associated namespace from the namespace label 310 to implement the repair mechanism during boot time or run time.

In a particular embodiment, DIMM controller 107 maintains a history of the assertions of the ALERT_n signal for ECC errors, and utilizes the history to predict failure in the system and to set one or more of ECC error thresholds. In particular, DIMM controller 107 operates to perform various statistical analysis on the history to predict failures of a particular data row of DRAM device 530, of the particular DRAM device, of a DDR5 channel, of DIMM 510, or of different logical partitions to which the DRAM device is associated with. For example, DIMM controller 107 can aggregate the correlation information retrieved from correlation information storage 543 based upon storage location, data row, DRAM device, DDR5 channel, DIMM, or based upon another memory organization of information handling system 100. DIMM controller 107 can then perform a pareto analysis on the aggregated correlation information to identify worst case elements of the interleaved DIMMs on information handling system 100, and can determine a likelihood of failure of one or more of the elements of the DIMMs, or likelihood of failure of one or more DIMMs in the interleaved DIMMs. In a particular case, trending can also be analyzed by DIMM controller 107. For example, DIMM controller 107 can determine that a rate of ECC errors that occur on a particular element of the DIMMs is worsening, and can take steps to isolate the particular element, such as by transferring data stored at the particular element to another DIMM on a different namespace, and remapping the data on processor 102.

DIMM controller 107 also operates to dynamically determine ECC error thresholds based upon the statistical analysis of the correlation information. For example, DIMM controller 107 can keep track of the age of DIMMs in information handling system and can increase one or more of the ECC error threshold and the ECC error rate threshold to account for the likely increase in the overall number of ECC errors or an expected increase in the ECC error rate of a DIMM over time. In this way, DIMM controller 107 can keep the number of received ALERT_n signal to a minimum level needed to detect significant events and to eliminate unnecessary noise in the receipt of ALERT_n signals.

Although the embodiment in FIG. 5 illustrates the DDR5 DIMM 510, other DIMMs as described in previous figures may be integrated for purposes of setting the custom DIMM-level namespace-based threshold to implement a predictive failure alerting mechanism that is defined for different namespaces and interleaved usage.

Figure 6:
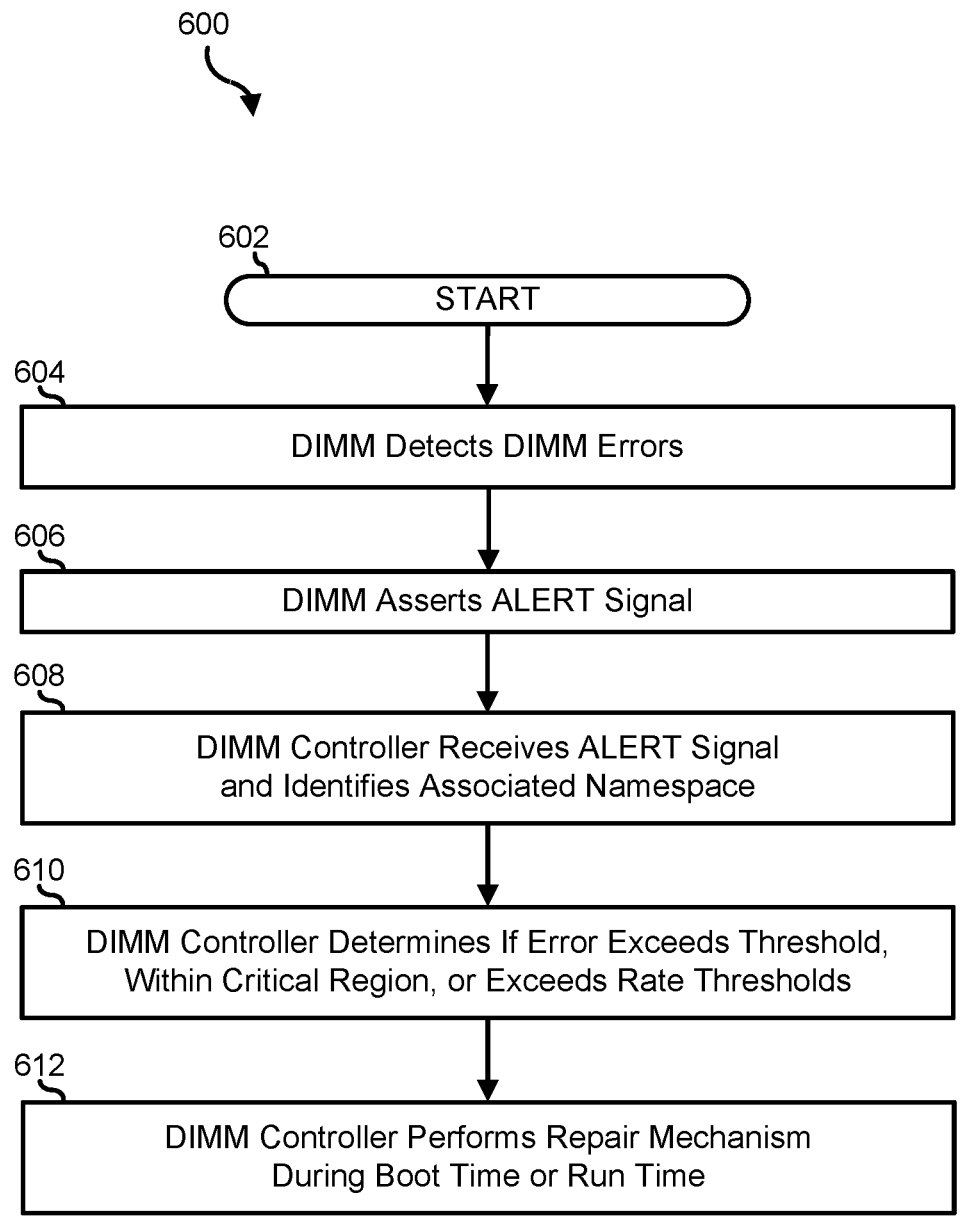
FIG. 6 is a flow chart showing a method of setting a custom DIMM-level namespace-based threshold to implement a predictive failure alerting mechanism defined for different namespaces and interleaved usage according to an embodiment of the present disclosure.

FIG. 6 shows a method of setting a custom DIMM-level namespace-based threshold to implement a predictive failure alerting mechanism defined for different namespaces and interleaved usage, starting at block 602. The DIMM detects DIMM error such as on-die ECC errors at block 604. At block 606, the DIMM asserts an alert signal based on the detected DIMM error. At block 608, the DIMM controller receives the alert signal and identifies the affected logical partition through identification of associated namespace. The DIMM controller will then determine, at block 610, if the DIMM error exceeded the error threshold, is within the critical region range of the error threshold, or has exceeded the error rate threshold. In response to this determination by the DIMM controller, the DIMM controller determines the impact of the detected DIMM error at the system level. Based from the determined impact of the detected DIMM error at the system level, the DIMM controller can implement the repair mechanism during boot time or run time at block 612.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
a plurality of interleaved dual in-line memory modules (DIMMs) that are partitioned into one or more logical partitions, wherein each logical partition is associated with a namespace; and
a DIMM controller coupled to the DIMMs, wherein the DIMM controller is configured to detect a DIMM error and to identify one of the logical partitions of the DIMM error using the namespace associated with the logical partition, and to perform a repair when a number of occurrences of the DIMM error exceeds an error correcting code (ECC) threshold.

2. The information handling system of claim 1, wherein the namespace includes a physical address and a range of portions allocated to each logical partition.

3. The information handling system of claim 1, wherein each namespace corresponds to a particular logical partition that is configured on each of the DIMMs by the DIMM controller.

4. The information handling system of claim 1, wherein a custom DIMM-level namespace-based threshold includes a comparison of the detected DIMM error to the ECC threshold.

5. The information handling system of claim 4, wherein the DIMM controller performs the repair when the detected DIMM error is within a critical region range of the ECC threshold.

6. The information handling system of claim 1, wherein the repair includes a mapping of data from an affected channel to another channel within a same or a different DIMM of the same namespace, or remapping the data from the affected channel to another channel within the same or different DIMM of a different namespace.

7. The information handling system of claim 1, wherein one of the DIMMs include a non-volatile DIMM.

8. The information handling system of claim 7, wherein the repair is performed during boot time or run time.

9. The information handling system of claim 1, wherein the DIMM controller is configured to duplicate, modify, transfer, or cancel data within the same associated namespace.

10. A method, comprising:
partitioning a plurality of dual in-line memory modules (DIMMs) into one or more logical partitions, wherein each logical partition is associated with a namespace;
detecting, by a DIMM controller, a DIMM error and identifying one of the logical partitions of the DIMM error using the namespace associated with the logical partition; and
performing a repair in response to a determined impact of the detected DIMM error when the detected DIMM error exceeds an error correcting code (ECC) threshold.

11. The method of claim 10, wherein the partitioning includes assigning of each logical partition to a different one of the DIMMs.

12. The method of claim 11, wherein the namespace includes a physical address and a range of portions allocated to each logical partition.

13. The method of claim 10, further comprising: setting of a custom DIMM-level namespace-based threshold by comparing the detected DIMM error to the ECC threshold.

14. The method of claim 13, wherein the repair is performed when the detected DIMM error is within a critical region range of the ECC threshold.

15. The method of claim 10, wherein the repair includes a mapping of data from the associated namespace to another namespace.

16. The method of claim 10, wherein the plurality of DIMMs include interleaved non-volatile DIMMs.

17. A server comprising:
a plurality of interleaved dual in-line memory modules (DIMMs) that are partitioned into one or more logical partitions, wherein each logical partition is associated with a namespace; and
a DIMM controller coupled to the interleaved DIMMs, wherein the DIMM controller is configured to detect a DIMM error and to identify one of the logical partitions of the DIMM error using the namespace associated with the logical partition, and to perform a repair when the detected DIMM error exceeds an error correcting code (ECC) threshold;
wherein the namespace includes a physical address and a range of portions allocated to each logical partition; and
wherein each namespace corresponds to a particular logical partition.

18. The server of claim 17, wherein the partitions are configured on the DIMMs by the DIMM controller.

19. The server of claim 18, wherein the DIMM controller is configured to dynamically modify, replace, reassign, or bypass the configured logical partition on the DIMMs.

20. The server of claim 17, wherein the interleaved DIMMs include one or more non-volatile DIMMs.

* * * * *